(12) United States Patent
Nguyen et al.

(10) Patent No.: US 9,984,868 B2
(45) Date of Patent: May 29, 2018

(54) PEALD OF FILMS COMPRISING SILICON NITRIDE

(71) Applicants: Victor Nguyen, Novato, CA (US); Woong Jae Lee, San Jose, CA (US); Mihaela Balseanu, Sunnyvale, CA (US); Li-Qun Xia, Cupertino, CA (US); Derek R. Witty, Fremont, CA (US)

(72) Inventors: Victor Nguyen, Novato, CA (US); Woong Jae Lee, San Jose, CA (US); Mihaela Balseanu, Sunnyvale, CA (US); Li-Qun Xia, Cupertino, CA (US); Derek R. Witty, Fremont, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days. days.

(21) Appl. No.: 14/211,024

(22) Filed: Mar. 14, 2014

(65) Prior Publication Data

US 2014/0273529 A1 Sep. 18, 2014

Related U.S. Application Data

(60) Provisional application No. 61/787,129, filed on Mar. 15, 2013.

(51) Int. Cl.
| | |
|---|---|
| *H01L 21/469* | (2006.01) |
| *H01L 21/02* | (2006.01) |
| *C23C 16/04* | (2006.01) |
| *C23C 16/34* | (2006.01) |
| *C23C 16/455* | (2006.01) |
| *C23C 16/56* | (2006.01) |

(52) U.S. Cl.
CPC ........ *H01L 21/0217* (2013.01); *C23C 16/045* (2013.01); *C23C 16/345* (2013.01); *C23C 16/45542* (2013.01); *C23C 16/56* (2013.01); *H01L 21/0228* (2013.01); *H01L 21/0234* (2013.01); *H01L 21/02211* (2013.01); *H01L 21/02274* (2013.01); *H01L 21/02348* (2013.01)

(58) Field of Classification Search
CPC ............. H01L 21/0217; H01L 21/0228; H01L 21/0234
USPC ....................................................... 438/792
See application file for complete search history.

(56) References Cited

U.S. PATENT DOCUMENTS

| | | |
|---|---|---|
| 5,186,718 A | 2/1993 | Tepman et al. |
| 6,949,481 B1 * | 9/2005 | Halliyal et al. ............... 438/795 |
| 7,732,342 B2 | 6/2010 | Balseanu et al. |
| 8,129,290 B2 | 3/2012 | Balseanu et al. |
| 8,138,104 B2 | 3/2012 | Balseanu et al. |
| 8,173,554 B2 | 6/2012 | Lee et al. |

(Continued)

FOREIGN PATENT DOCUMENTS

| | | | |
|---|---|---|---|
| WO | WO-2009/149167 | 12/2009 | |
| WO | WO 2012147680 A1 * | 11/2012 | ........... C23C 16/345 |

*Primary Examiner* — Syed Gheyas
(74) *Attorney, Agent, or Firm* — Servilla Whitney LLC

(57) ABSTRACT

Provided are methods of for deposition of SiN films via PEALD processes. Certain methods pertain to exposing a substrate surface to a silicon precursor to provide a silicon precursor at the substrate surface; purging excess silicon precursor; exposing the substrate surface to an ionized reducing agent; and purging excess ionized reducing agent to provide a film comprising SiN, wherein the substrate has a temperature of 23° C. to about 550° C.

11 Claims, 5 Drawing Sheets

(56) References Cited

U.S. PATENT DOCUMENTS

| | | | |
|---|---|---|---|
| 2003/0215570 A1* | 11/2003 | Seutter | C23C 16/345 427/255.394 |
| 2006/0269693 A1 | 11/2006 | Balseanu et al. | |
| 2008/0242116 A1* | 10/2008 | Clark | C23C 16/345 438/791 |
| 2009/0137132 A1 | 5/2009 | Bhatia et al. | |
| 2011/0256734 A1* | 10/2011 | Hausmann et al. | 438/776 |
| 2013/0183835 A1 | 7/2013 | Nguyen et al. | |
| 2013/0210241 A1* | 8/2013 | LaVoie et al. | 438/791 |
| 2013/0323435 A1* | 12/2013 | Xiao | C09D 1/00 427/579 |
| 2014/0030448 A1* | 1/2014 | Bowen et al. | 427/578 |
| 2014/0051263 A1* | 2/2014 | Tanaka | C23C 16/345 438/778 |
| 2014/0141625 A1* | 5/2014 | Fukazawa | H01L 21/02211 438/791 |
| 2014/0273526 A1* | 9/2014 | Thompson | H01L 21/02211 438/786 |
| 2014/0273527 A1* | 9/2014 | Niskanen et al. | 438/792 |
| 2014/0273528 A1* | 9/2014 | Niskanen | H01L 21/0234 438/792 |

* cited by examiner

PEALD OF FILMS COMPRISING SILICON NITRIDE

CROSS-REFERENCE TO RELATED APPLICATIONS

This application claims priority to U.S. Provisional Application No. 61/787,129, filed Mar. 15, 2013, the entire contents of which are herein incorporated by reference in their entirety.

TECHNICAL FIELD

The present invention relates generally to methods of depositing thin films. In particular, the invention relates to atomic layer deposition (ALD) processes for the deposition of SiN films.

BACKGROUND

In the manufacture of electronic devices such as integrated circuits, a target substrate, such as a semiconductor wafer, is subjected to various processes, such as film formation, etching, oxidation, diffusion, reformation, annealing, and natural oxide film removal. Silicon-containing films are an important part of many of these processes.

Silicon-containing films are used for a wide variety of applications in the semiconductor industry. Examples of silicon-containing films include epitaxial silicon, polycrystalline silicon (poly-Si), and amorphous silicon, epitaxial silicon germanium (SiGe), silicon germanium carbide (SiGeC), silicon oxide (SiO), silicon carbide (SiC), silicon nitride (SiN), silicon oxynitride (SiON), silicon carbonitride (SiCN), and silicon carboxide (SiCO). As circuit geometries shrink to smaller feature sizes, thinner films with better coverage on high aspect ratio structures are required. As device technology advances, metallization schemes also are more sophisticated and require lower thermal stresses. Therefore, lower deposition temperatures for Si-containing films are preferred.

Silicon nitride films have very good oxidation resistance and dielectric qualities. Accordingly, these films have been used in many applications, including oxide/nitride/oxide stacks, etch stops, oxygen diffusion barriers, and gate insulation layers, among others. Conformal coverage with low pattern loading effect of dielectric films on high aspect ratio structures are of critical requirement as device node shrinks down to below 45 nm.

Several methods are known for forming a silicon nitride film on the surface of a semiconductor wafer by chemical vapor deposition (CVD). In thermal CVD, a silane gas, such as monosilane ($SiH_4$) or polysilanes, is used as a silicon source gas. However, CVD processes often result in non-conformal films.

Silicon nitride films from furnace processes offer good conformality. However, the drawbacks include high temperature requirement ($\geq 550°$ C.), lack of wafer-to-wafer uniformity and few capabilities to engineer film compositions and properties especially stress for different applications.

Silane-based plasma enhanced chemical vapor deposition (PE-CVD) high tensile stress nitride films have been proven to improve carrier mobility, and thus device performance. However, the films have poor step coverage due to directionality of radical fluxes. As a result, the improvement effect is diminished when device dimension reduces.

Atomic layer deposition (ALD) processes offer much improved conformality and pattern loading than CVD processes. SiN film formation has also been carried out via ALD with halogenated silane precursors and ammonia in furnace type reactors. However, this process requires high temperatures, in excess of 550° C., to effect clean conversion and eliminate $NH_4X$ byproducts. In device manufacturing, processes that can be performed at lower temperatures are generally desired for thermal budget and other reasons.

Accordingly, there is a need for a low-temperature deposition process which can offer highly conformal SiN-containing films, while also addressing any of the other currently problems described above.

SUMMARY

A first aspect of the invention relates to a method of plasma enhanced atomic layer deposition of a film comprising SiN. The method comprises exposing a substrate surface to a silicon precursor to provide a silicon precursor at the substrate surface; purging excess silicon precursor; exposing the substrate surface to an ionized reducing agent comprising a nitrogen precursor; and purging excess ionized reducing agent to provide a film comprising SiN, wherein the substrate has a temperature of 23° C. to about 550° C. In one or more embodiments, the substrate temperature ranges from about 200 to about 400° C.

In one or more embodiments, the silicon precursor comprises a Si—X bond, wherein X is a halogen. In some embodiments, the silicon precursor comprises $SiH_{4-y}X_y$ or $X_{3-z}H_zSi$—$SiH_zX_{3-z}$, wherein X is a halide selected from the group consisting of Cl, Br and I, y has a value of 1 to 4, and z has a value of 0 to 2. In one or more embodiments, the ionized reducing agent comprises ammonia, nitrogen, hydrogen, an alkyl amine, hydrazine or a substituted hydrazine. In some embodiments, the alkyl amine comprises dimethyl amine. In one or more embodiments, the substituted hydrazine comprises $CH_3N_2H$. In some embodiments, the silicon precursor comprises hexachlorodisilane. In one or more embodiments, the film comprising SiN has a thickness of about 50 to about 500 Angstroms. In some embodiments, the method further comprises exposing the exposing the film comprising SiN to a plasma treatment to increase the tensile strength of the film. In one or more embodiments, the film comprising SiN has a thickness of about 10 to about 40 Angstroms.

A second aspect of the invention also relates to a method of plasma enhanced atomic layer deposition of a film comprising SiN. The method comprises exposing a substrate surface to a precursor comprising silicon and nitrogen to provide a precursor silicon and nitrogen at the substrate surface; purging excess silicon precursor; exposing the substrate surface to an ionized reducing agent; purging excess ionized reducing agent to provide a film comprising SiN, wherein the substrate has a temperature of 23° C. to about 550, 600, or 650° C.

In some embodiments, the precursor comprising silicon and nitrogen are selected from the group consisting of $N(SiH_3)_3$, $(SiH_3)_2NH$, aminosilane, and bis-diethylamine silane. In one or more embodiments, the substrate temperature ranges from about 200 to about 400° C. In some embodiments, the ionized reducing agent comprises ammonia, nitrogen, hydrogen, an alkyl amine, hydrazine or a substituted hydrazine. In one or more embodiments, the alkyl amine comprises dimethyl amine. In some embodiments, the substituted hydrazine comprises $CH_3N_2H$. In one or more embodiments, the precursor comprising silicon and nitrogen comprises $N(SiH_3)_3$. In some embodiments, the method comprises exposing the exposing the film comprising SiN to a plasma treatment to increase the tensile strength of the film.

Another aspect of the invention relates to a method of plasma enhanced atomic layer deposition of a film comprising SiN, the method comprising: exposing a substrate surface to a silicon precursor to provide a silicon precursor at the substrate surface; purging excess silicon precursor; exposing the substrate surface to an ionized reducing agent comprising a nitrogen precursor; purging excess ionized reducing agent to provide a film comprising SiN, wherein the substrate has a temperature of 23° C. to about 550° C.; repeating (a)-(d); exposing the film comprising SiN to a plasma treatment once about 10 to about 40 Angstroms of film have been deposited.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
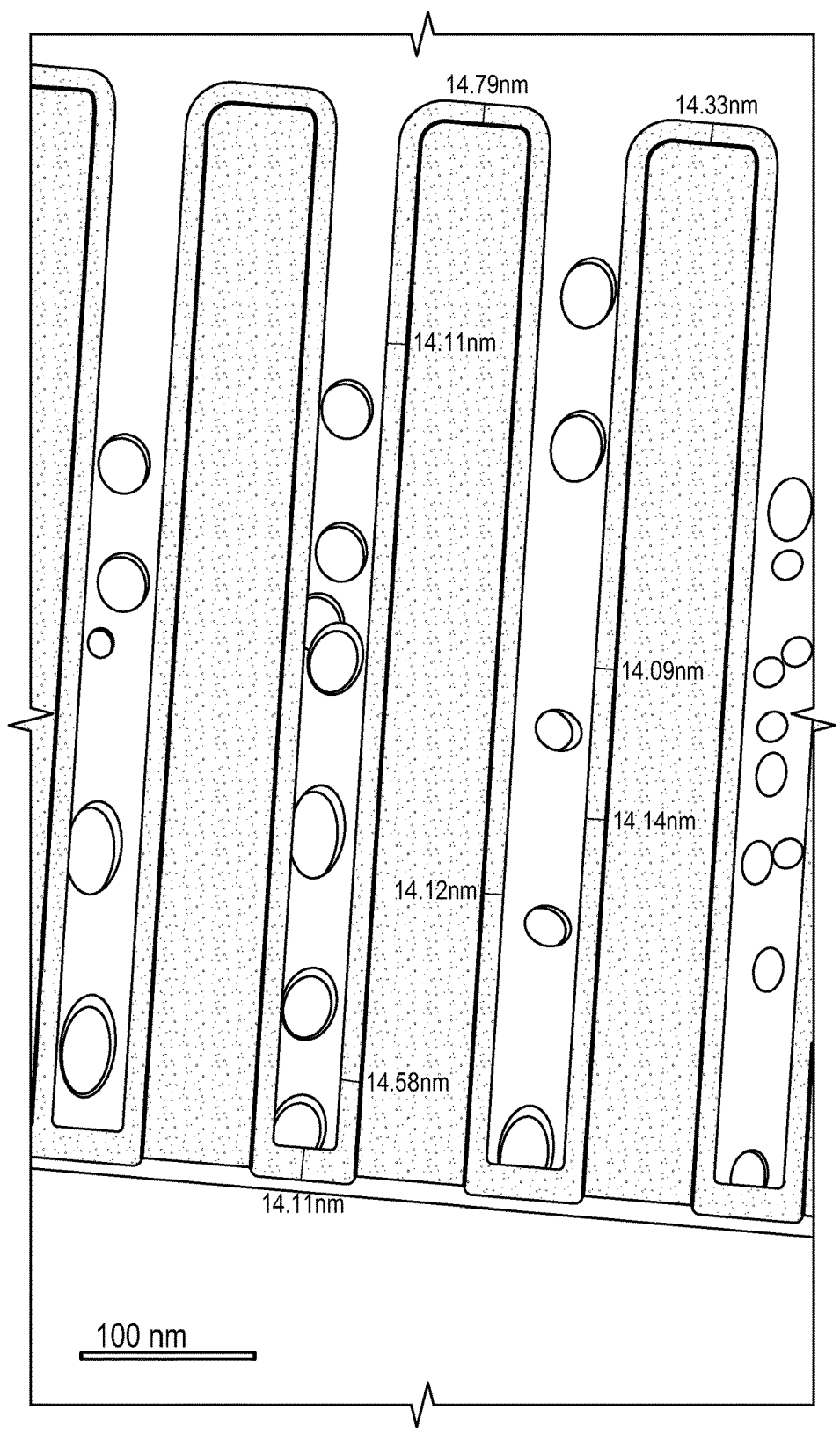
FIG. 1 is a transmission electron microscope (TEM) image of a film deposited according to one or more embodiments of the invention.

Before describing several exemplary embodiments of the invention, it is to be understood that the invention is not limited to the details of construction or process steps set forth in the following description. The invention is capable of other embodiments and of being practiced or being carried out in various ways. It is also to be understood that some chemical compounds may be illustrated herein using structural formulas which have a particular stereochemistry. These illustrations are intended as examples only and are not to be construed as limiting the disclosed structure to any particular stereochemistry. Rather, the illustrated structures are intended to encompass all such compounds having the indicated chemical formula.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present invention any of the film processing disclosed may also be performed on an underlayer formed on the substrate as disclosed in more detail below, and the term "substrate surface" is intended to include such underlayer as the context indicates.

It has been discovered that highly conformal films comprising SiN can be deposited using a plasma-enhanced atomic layer deposition (PEALD) process. Such a process includes a silicon precursor and a plasma reducing agent. In one or more embodiments, the processed described herein deposit low pattern loading, conformal nitride films by PEALD as spacer and etch stop layers in memory and logic process flow. One or more embodiments advantageously allow for low temperature processing (including well below 550° C.). Such temperatures are particularly suitable for high-k dielectric processing. Another benefit of one or more of the processes described herein is the capability of tailoring conformal films to desired composition and properties. The properties of the films can be tuned by using one or a combination of the methods described below, including post-treatment using plasma and/or ultraviolet (UV) cure.

Accordingly, one aspect of the invention relates to a method of plasma enhanced atomic layer deposition of a film comprising SiN. The method comprises exposing a substrate surface to a silicon precursor to provide a silicon precursor at the substrate surface; purging excess silicon precursor; exposing the substrate surface to an ionized reducing agent comprising a nitrogen precursor; and purging excess ionized reducing agent to provide a film comprising SiN, wherein the substrate has a temperature of 23° C. to about 550, 600, or 650° C. In some embodiments, the method comprises exposing a substrate surface to a precursor comprising silicon and nitrogen to provide a precursor comprising silicon and nitrogen at the substrate surface; purging excess silicon precursor; exposing the substrate surface to an ionized reducing agent; and purging excess ionized reducing agent to provide a film comprising SiN, wherein the substrate has a temperature of 23° C. to about 550, 600, or 650° C. In one or more embodiments, "to provide a precursor at the substrate surface" means that the silicon precursor saturates the substrate surface with a layer of the silicon precursor's reacting species. In one or more embodiments, the ionized reducing agent comprises ammonia, nitrogen, hydrogen, an alkyl amine, hydrazine or a substituted hydrazine.

As used herein, "SiN" refers to a deposited film that comprises Si—N bond linkages. In some embodiments, the film may be represented by the formula $Si_3N_x$, where x is equal to about 4. It will be understood that the variable x may vary depending on the specific precursors chosen, including the initial ratio of silicon to carbon in the precursors.

In the first part of the ALD cycle, a substrate surface is exposed to a silicon precursor. In some embodiments, exposure to the silicon precursor results in the silicon precursor reacting with the surface. In one or more embodiments, the silicon precursor may be a halogenated silane. That is, in some embodiments, the silicon precursor comprises a Si—X bond, wherein X is a halogen. In further embodiments, the silicon precursor comprises $SiH_{4-y}X_y$, or $X_{3-z}H_zSi—SiH_zX_{3-z}$, wherein X is a halide selected from the group consisting of Cl, Br and I, y has a value of 1 to 4, and z has a value of 0 to 2. In some embodiments, the first precursor comprises SiX$_4$. In other embodiments, the first precursor comprises X$_3$Si—SiX$_3$. In one or more embodiments, each X is independently selected from Cl, Br and I. In further embodiments, embodiments at least one of the X groups is Cl. Examples of such halogenated silanes include, but are not limited to, hexachlorodisilane (HCDS), monochorosilane, and dichlorosilane (DCS). In even further embodiments, all X groups are Cl. In embodiments where the first precursor comprises X$_3$Si—SiX$_3$, and all X groups are chlorine, the compound is Cl$_3$Si—SiCl$_3$, also known as hexachlorodisilane. Accordingly, in one or more embodiments, the silicon precursor is selected from SiCl$_4$, SiBr$_4$, or SiI$_4$.

In one or more embodiments, the silicon precursor may also comprise carbon. Such examples include alkyl halogenated silanes, which may have formula (X$_y$H$_{3-y}$Si)$_z$CH$_{4-z}$. In one or more embodiments, each X is independently selected from Cl, Br and I. In further embodiments, embodiments at least one of the X groups is Cl. In even further embodiments, all X groups are Cl. Such a compound is known as bis(trichlorosilyl)methane (BTCSM), hexachlorodisilylmethylene (HCDSM), 1,1'-methylenebis(1,1,1-trichlorosilane), or methylenebis(trichlorosilane), and has a structure represented by:

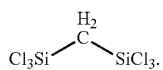

Other examples of suitable precursors include, but are not limited to those having a structure represented by:

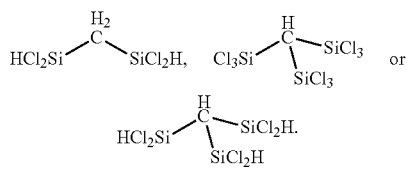

In other embodiments, the first precursor has a formula (X$_y$H$_{3-y}$Si)(CH$_2$)$_n$(SiX$_y$H$_{3-y}$). In further embodiments, n has a value of 2 or 3, or in even further embodiments, 2. Compounds of this formula may be used to further increase the carbon content, as the starting C:Si ratio will be higher. In one or more embodiments, each X is independently selected from Cl, Br and I. In further embodiments, embodiments at least one of the X groups is Cl. In even further embodiments, all X groups are Cl.

In yet other embodiments, the first precursor comprises (X$_y$H$_{3-y}$Si)(CH$_2$)(SiX$_p$H$_{2-p}$)(CH$_2$)(SiX$_y$H$_{3-y}$), wherein X is a halogen, y has a value of between 1 and 3, p has a value of between 0 and 2. In one or more embodiments, each X is independently selected from Cl, Br and I. In further embodiments, embodiments at least one of the X groups is Cl. In even further embodiments, all X groups are Cl. Examples of such precursors include, but are not limited to, (ClSiH$_2$)(CH$_2$)(SiH$_2$)(CH$_2$)(SiH$_2$Cl) and (Cl$_2$SiH)(CH$_2$)(SiClH)(CH$_2$)(SiHCl$_2$).

In some embodiments, the silicon precursor may also comprise nitrogen. Examples of such precursors include amine-halogenated silanes, which also contain both silicon and nitrogen atoms. Examples of such compounds include, but are not limited to trisylylamine (TSA) and bis-diethylamine silane (BDEAS). Other examples of silicon precursors also containing nitrogen include silazane-based precursors. Such compounds have the formula:

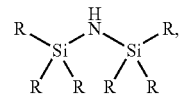

wherein each R is independently hydrogen or C1-C6 alkyl. In some embodiments, at least one of the R groups is methyl. In further embodiments, the silicon precursor is silazane. In other embodiments, the silicon precursor has formula (SiH$_3$)$_2$NH. It should be noted that where the R group contains carbon, the resulting film may contain carbon as well.

Suitable process flow rates will depend on the specific precursor chosen. However, generally, where the silicon precursor is a gas, the flow rate will range from about 1 sccm to about 5000 sccm. In further embodiments, the flow rate will range from 25, 50, 75 or 100 to about 200, 250, 300, 350, 400, 500 or 600 sccm. Suitable gas flow rates for a halogenated silane precursor (e.g., dichlorosilane) may be about 100 to about 200 sccm. Generally, where the silicon precursor is a liquid, the flow rate will range from about 1 sccm to about 5000 mgm. In further embodiments, the flow rate will range from 10, 20, 30, or 50 to about 100, 125, 150, 175, 200 or 250 sccm. Suitable liquid flow rates for a halogenated silane precursor (e.g., HCDS) may be about 50 to about 100 mgm.

Once the substrate surface has been exposed to the silicon precursor, excess unreacted precursor may be removed. For example, excess silicon precursor may be pumped away, leaving behind a monolayer of atoms on all surfaces. It is thought that the reaction is self-saturating because the layer has halogen-terminated bonds. The self-saturating nature of the reaction helps to provide excellent step coverage.

Once the monolayer of atoms is provided at the substrate surface, the substrate surface may then be exposed to a reducing agent. Usually, at lower surface temperature (e.g., below 550, 600, or 650° C.), reaction between NH$_3$-based gases and the layer becomes less effective. However, it has been discovered that an ionizedreducing gases by plasma greatly increases the effectiveness of the reaction due to higher energy levels. The gases can be ionized inside the chamber, or outside (i.e., remotely) then flown into the chamber. Exemplary reducing agents include, but are not limited to NH$_3$, H$_2$, and N$_2$. Reducing agents which contain nitrogen will act as nitrogen precursors for the film. Hydrogen can be a suitable reducing agent where the silicon precursor also contains nitrogen, and the objective is to engineer the nitrogen atomic composition in the film. Reactions of the film with these gases result in the removal of halogen atoms cross-linking to form the Si—N—Si network. The reducing gases may then be pumped or purged away.

Suitable process flow rates will depend on the specific reductant chosen. Generally, the flow rate will range from about 1 sccm to about 25000 sccm. In further embodiments, the flow rate will range from 250, 500, 750 or 1000 to about 2000, 2250, 2500 or 2750 sccm. Suitable gas flow rates for some reducing agents (e.g., NH$_3$) may be about 100 to about 200 sccm.

One or more of the processes described herein include a purge. The purging process keeps the reagents separate. Unwanted mixture of reagents may degrade step coverage. The substrate and chamber may be exposed to a purge step after stopping the flow of one or more of the reagents. A purge gas may be administered into the processing chamber with a flow rate within a range from about 10 sccm to about 10,000 sccm, for example, from about 50 sccm to about 5,000 sccm, and in a specific example, about 1000 sccm. The purge step removes any excess precursor, byproducts and other contaminants within the processing chamber. The purge step may be conducted for a time period within a range from about 0.1 seconds to about 60 seconds, for example, from about 1 second to about 10 seconds, and in a specific example, from about 5 seconds. The carrier gas, the purge gas, the deposition gas, or other process gas may contain nitrogen, hydrogen, argon, neon, helium, or combinations thereof. In one example, the carrier gas comprises argon and nitrogen.

The precursor and/or reducing gases may be diluted with an inert gas. Examples include noble gases and $N_2$. In one or more embodiments, the flow rate of an inert dilution ranges from about 1 to about 25000 sccm. In further embodiments, the flow rate will range from about 1000 to about 5000 sccm.

Chamber pressure during the deposition process may range from about 1 Torr to about 50 Torr. In further embodiments, the pressure may range from about 1 to about 15 Torr. In some embodiments, the pressure may be about 4, 5, 6, 7, 8, 9 or 10 Torr.

The above process can be repeated until a desired film thickness is achieved. Thus, following the above, the silicon precursors may be re-introduced, following by another purge, flow of ionized reducing agent, and another purge. The cyclic process continues until we achieve the targeted film thickness.

An advantage of one or more of the process described herein is that deposition can take place at relatively low temperatures. In some embodiments, the substrate surface has (deposition is carried out at) a temperature of about 20° C. to about 550, 600, or 650° C. In one or more embodiments, the deposition is carried out at a temperature of about 50, 100, 200, 250 or 300° C. to about 400, 450 or 500° C. In some embodiments, the substrate temperature ranges from about 200 to about 400° C.

In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to 350 kHz, 13.56 MHz, and 60 MHz.

Other plasma conditions may range depending on the specific process. Generally, the plasma power will range from about 1 W to about 1 kW. In further embodiments, the plasma power will be about 50, 75, 100, 125, 150, 175, 200, 300 or 400 W. Exposure time of the plasma per layer may range from about 1 second to about 60 seconds. In further embodiments, the plasma exposure time may be range from about 5 or 10 seconds to about 20, 30 or 40 seconds. In further embodiments, the plasma exposure time is about 10 seconds.

In some embodiments, post-deposition treatment methods may be utilized to engineer the film properties, particularly stress enhancement. As used herein, "post-deposition" means that the treatment is carried out after at least one PEALD cycle. In some embodiments, the treatment process is carried out at certain film thickness intervals and/or cycles, and in other embodiments, the treatment process is carried out once deposition is completed. In some embodiments, the post-deposition treatment is carried out without a vacuum break after deposition of the SiN film. This will help to avoid oxidation of the conformal SiN film.

In one or more embodiments, the post-deposition treatment comprises a plasma treatment. The plasma treatment may be utilized to increase the tensile strength of the film. While not wishing to be bound to any particular theory, it is thought that the tensile strength of the film is increased because the plasma removes hydrogen from the film. The plasma treatment may be carried out after the deposition of a film of a given thickness. For example, a plasma treatment may be carried out every 10 to 40 Angstroms of film deposited, or more specifically about every 20 Angstroms.

In some embodiments, the post-deposition treatment comprises treatment with ultraviolet (UV) light. An example of such a treatment is UV annealing/cure. With an UV treatment process, the tensile stress of one or more of the films described herein can be increased from 0.5 GPa to 1.3 GPa, or even higher. The UV treatment may be carried out after the deposition of a film of a given thickness. For example, a UV cure may be carried out every 50 to 500 Angstroms of film deposited, or more specifically about every 100 to 200 Angstroms.

Thus, in an exemplary process, the method comprises:
(a) exposing a substrate surface to a silicon precursor to provide a silicon precursor at the substrate surface;
(b) purging excess silicon precursor;
(c) exposing the substrate surface to an ionized reducing agent comprising a nitrogen precursor;
(d) purging excess ionized reducing agent to provide a film comprising SiN, wherein the substrate has a temperature of 23° C. to about 550, 600, or 650° C.;
(e) repeating (a)-(d);
(f) exposing the film comprising SiN to a plasma treatment once about 10 to about 40 Angstroms of film have been deposited, or a UV cure once about 50 to about 500 Angstroms of film have been deposited.

The precursors/reagents may be flowed and/or exposed to the substrate surface either sequentially or substantially sequentially. The process may be repeated up until a desired film thickness has been achieved. As used herein, "substantially sequentially" refers to where a majority of the exposure/flow of a given precursor does not overlap with the flow/exposure of another precursor, although there may be some overlap.

The films resulting from one or more of the deposition processes described herein result in a film with good step coverage and conformality. One measure of conformality is the ratio of sidewall/top and bottom/top thickness ratio. Perfect conformality corresponds to a ratio of 100% (i.e., the two thicknesses are the same). In one or more embodiments, the ratios achieved by the processes described herein are greater than 95%. Another useful measurement is the pattern loading effect (PLE) is the difference in thicknesses in isolated field area versus dense area, and represents the difference between field and structure thickness. Usually, a PLE value of less than 5% is desirable. In one or more embodiments, the process described herein can provide a PLE value of less than about 5, 4, or 3%.

The specific reaction conditions for the ALD reaction will be selected based on the properties of the film precursors, substrate surface, etc. The deposition may be carried out at atmospheric pressure, but may also be carried out at reduced pressure. The substrate temperature should be low enough to keep the bonds of the substrate surface intact and to prevent thermal decomposition of gaseous reactants. However, the substrate temperature should also be high enough to keep the film precursors in the gaseous phase and to provide sufficient energy for surface reactions. The specific temperature depends on the specific substrate, film precursors, and pressure. The properties of the specific substrate, film precursors, etc. may be evaluated using methods known in the art, allowing selection of appropriate temperature and pressure for the reaction.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system," and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present invention are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as rapid thermal processing (RTP), plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, like a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In atomic layer deposition type chambers, the substrate can be exposed to the first and second precursors either spatially or temporally separated processes. Temporal ALD is a traditional process in which the first precursor flows into the chamber to react with the surface. The first precursor is purged from the chamber before flowing the second precursor. In spatial ALD, both the first and second precursors are simultaneously flowed to the chamber but are separated spatially so that there is a region between the flows that prevents mixing of the precursors. In spatial ALD, the substrate must be moved relative to the gas distribution plate, or vice-versa.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

EXAMPLES

Example 1

A silicon nitride film was deposited. The film spacer was deposited onto poly-silicon structures in dense 7:1 AR with a gap of 60 nm, and in isolated field areas. The film is formed on a silicon wafer substrate at a substrate temperature of 400° C. In this ALD reaction, the silicon precursor comprised liquid hexachlorodisilane (HCDS) nitrogen precursor comprised ammonia.

Figure 2A:
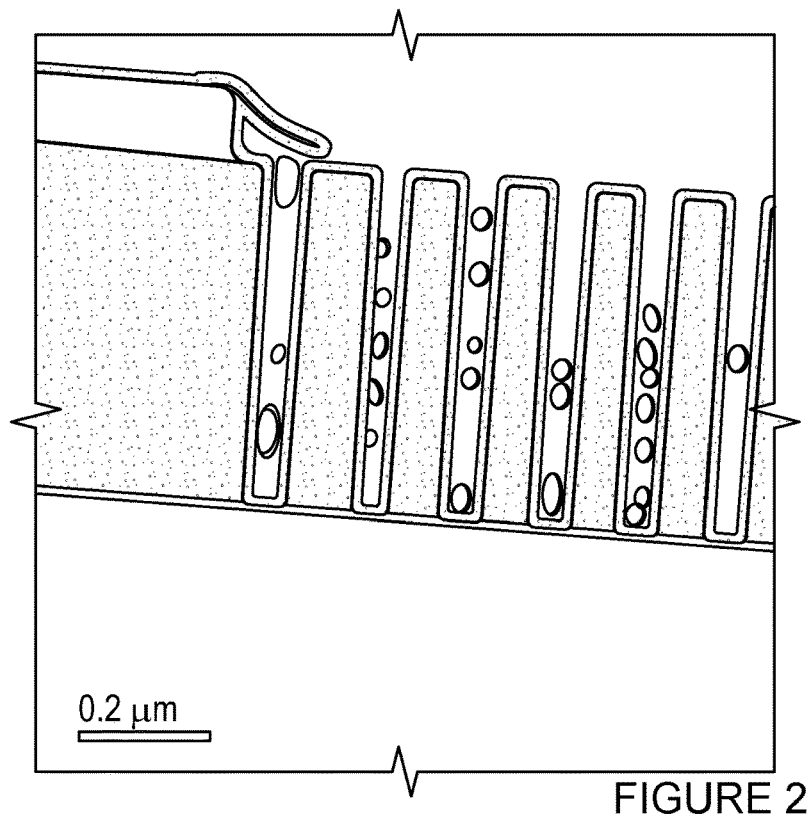
FIGS. 2A-B are TEM images of a film deposited according to one or more embodiments of the invention.
Figure 2B:
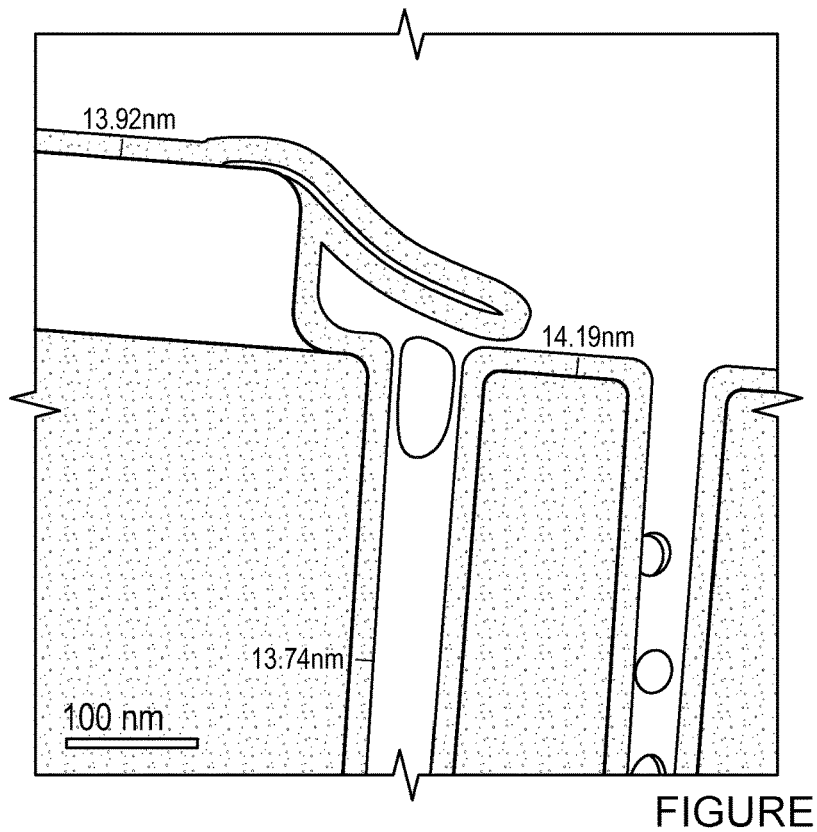
Figure 3:
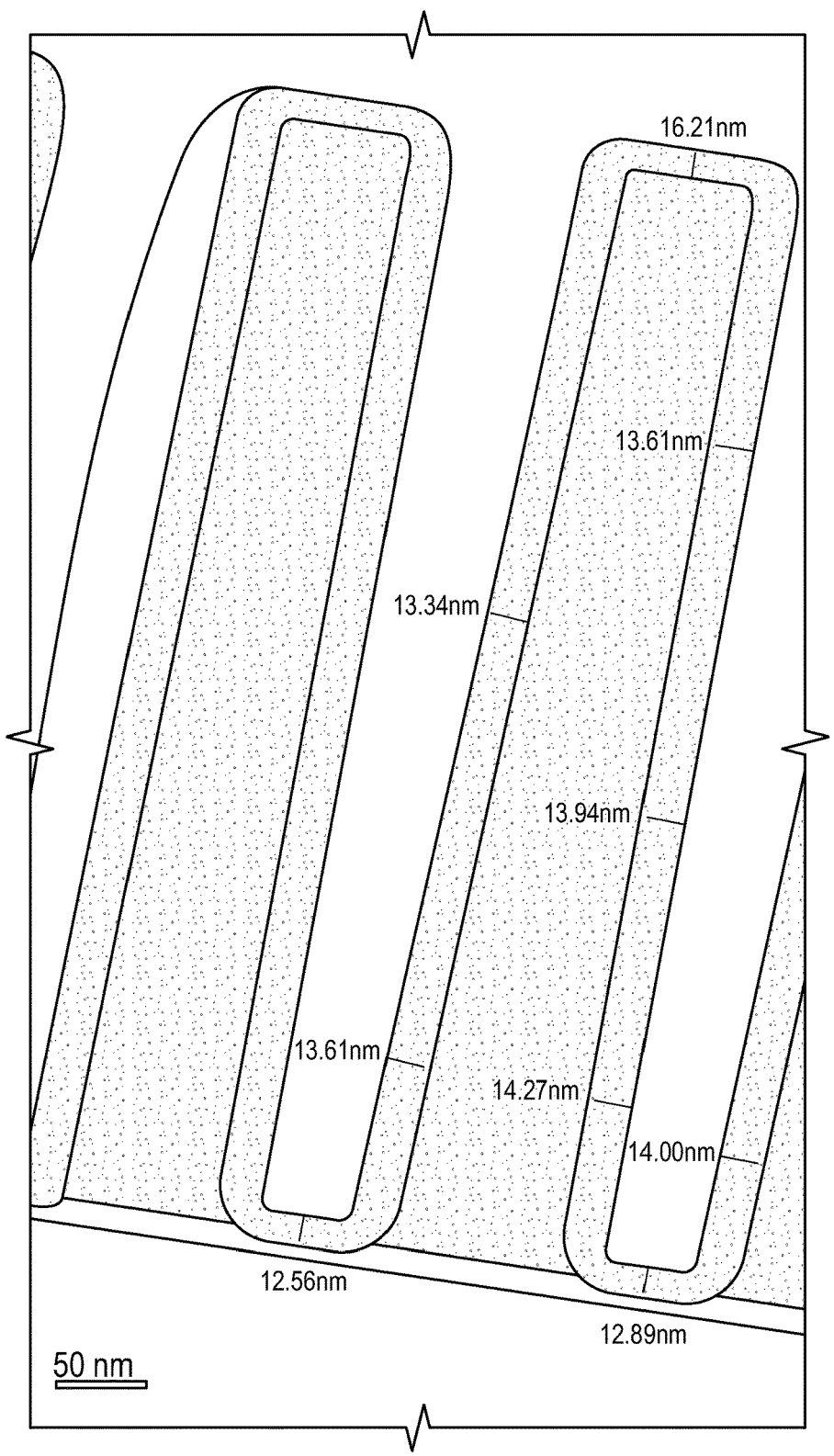
FIG. 3 is a TEM image of a film deposited according to one or more embodiments of the invention.

FIG. 1 is a TEM image of the film. FIGS. 2A-2B and 3 are also TEM images of the film. FIG. 2B offers a zoomed in view of FIG. 2A. FIG. 3 is an alternate view. FIGS. 1 and 2A-B also show measurements of the film thickness in various places. There is little variation, demonstrating a highly conformal film. The measured sidewall/top and bottom/top thickness ratio of 95% and PLE of only 3%.

Example 2

A film according to Example 1 was deposited. The film produced by conventional ALD is considered to be comparative, as it does not feature the use of an ionized reducing agent.

Figure 4:
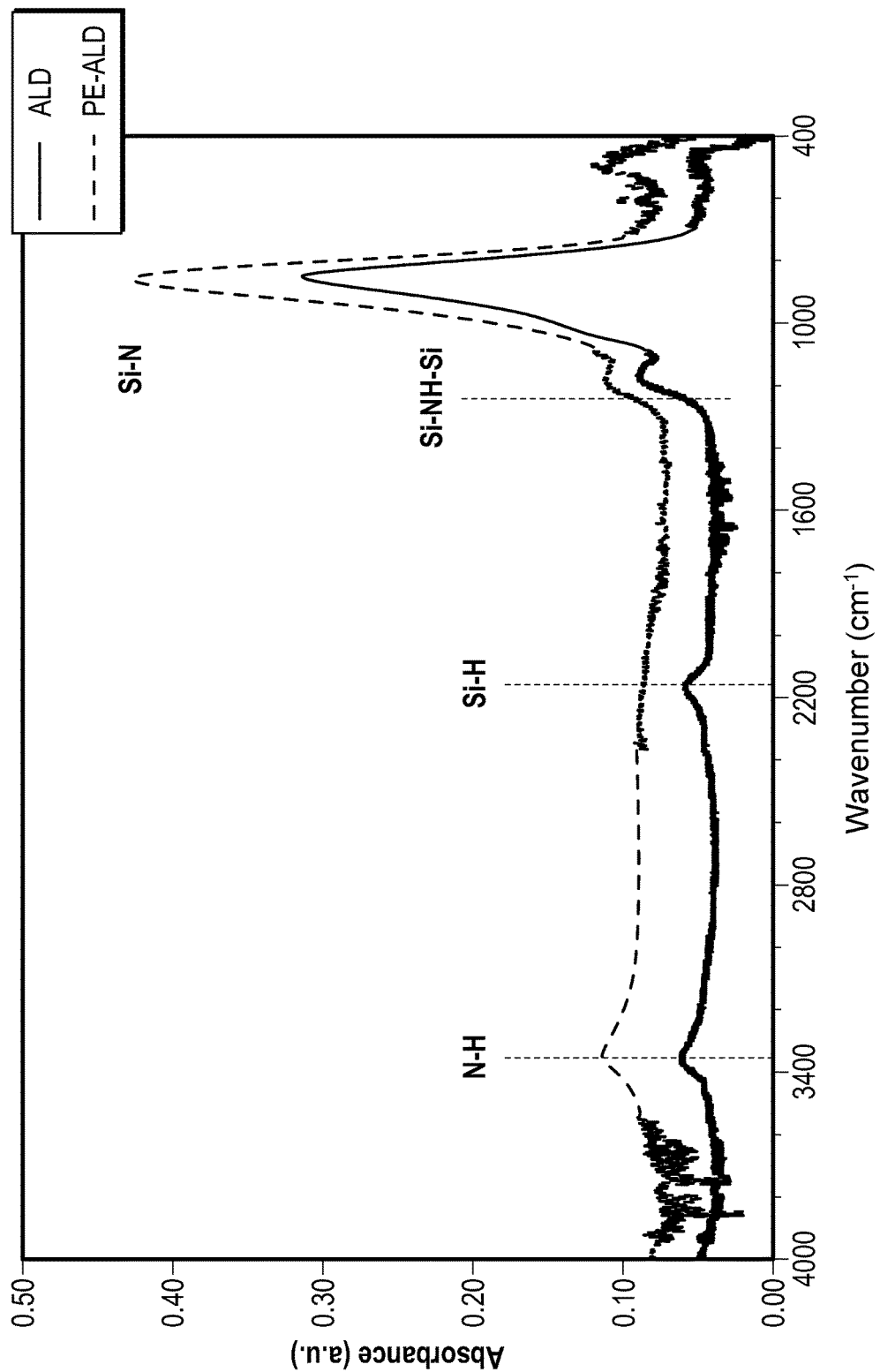
FIG. 4 shows the FTIR spectra of a film deposited according to one or more embodiments of the invention and a comparative film.

As discussed above, the film properties can also be tuned with PEALD, which can be demonstrated via Fourier Transform Infrared Spectra (FTIR) as shown in FIG. 4. FIG. 4 demonstrates the compositional difference between the thermal ALD and PEALD films. Specifically, this can also be observed via the bond ratio of SiH/NH (at 2200 cm$^{-1}$, 3400 cm$^{-1}$ respectively). As shown in the FTIR spectra, the N—H and Si—H peaks are much higher for the ALD process.

Figure 5:
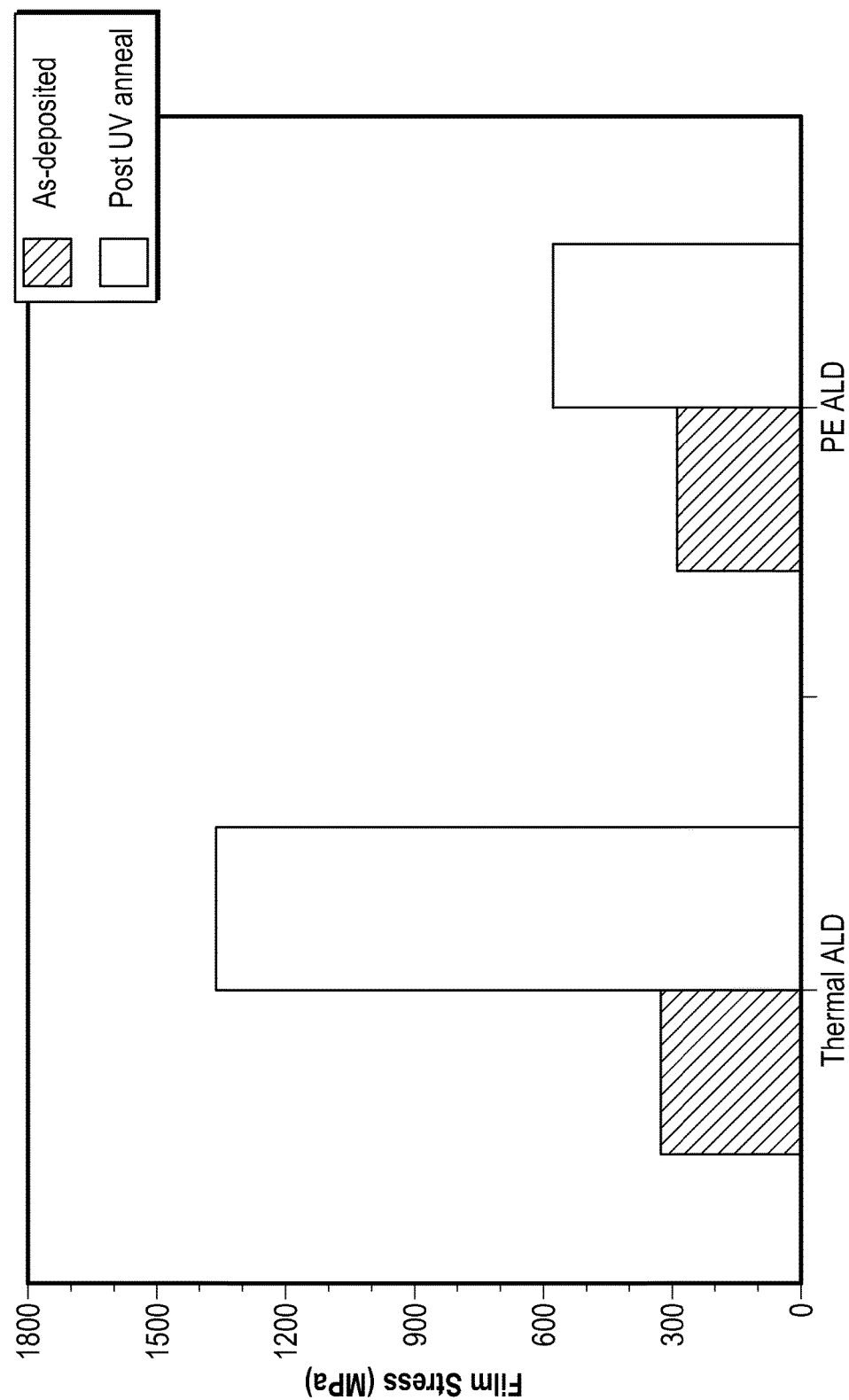
FIG. 5 shows a graph of the film stress of a film deposited according to one or more embodiments of the invention and a comparative film.

The tensile stress increment for the two films was measured as-deposited and after post-treatment with a UV anneal process measured by KLA-Tencor F-series. The results of tensile stress are shown in FIG. 5. As shown in the figure, the film stress was much greater after post-deposition UV anneal. This high stress increment signifies the process capabilities in tailoring the film composition during PEALD deposition, specifically to have a 1:1 ratio between NH— and SiH— bonds. In a furnace-type ALD film, the H composition and distribution is impossible to control due to higher temperature and nature of thermal reaction.

What is claimed is:

1. A method of plasma enhanced atomic layer deposition of a film comprising SiN, the method comprising:
  exposing a substrate surface to a silicon precursor to provide a silicon precursor at the substrate surface, wherein the silicon precursor comprises $(X_yH_{3-y}Si)_zCH_{4-z}$, wherein X is a halide selected from the group consisting of Cl, Br, and I, y has a value of 0 to 3 and z has a value of 1 to 3;
  purging excess silicon precursor;
  exposing the substrate surface to an ionized reducing agent comprising a nitrogen precursor; and
  purging excess ionized reducing agent to provide a film comprising SiN, wherein the substrate has a temperature of 23° C. to about 550° C.

2. The method of claim 1, wherein the substrate temperature ranges from about 200 to about 400° C.

3. The method of claim 1, wherein the ionized reducing agent comprises ammonia, nitrogen, hydrogen, an alkyl amine, hydrazine or a substituted hydrazine.

4. The method of claim 3, wherein the alkyl amine comprises dimethyl amine.

5. The method of claim 3, wherein the substituted hydrazine comprises $CH_3N_2H$.

6. The method of claim 1, wherein the silicon precursor comprises hexachlorodisilane.

7. The method of claim 1, wherein the film comprising SiN has a thickness of about 50 to about 500 Angstroms.

8. The method of claim 1, further comprising exposing the film comprising SiN to a plasma treatment to increase the tensile strength of the film.

9. The method of claim 7, wherein the film comprising SiN has a thickness of about 10 to about 40 Angstroms.

10. A method of plasma enhanced atomic layer deposition of a film comprising SiN, the method comprising:
  (a) exposing a substrate surface to a silicon precursor to provide a silicon precursor at the substrate surface, the silicon precursor comprising a compound having the formula $(X_yH_{3-y}Si)_zCH_{4-z}$, where X is one or more of Cl, Br or I, y is from 0 to 3 and z is from 1 to 4;
  (b) purging excess silicon precursor;
  (c) exposing the substrate surface to an ionized reducing agent comprising a nitrogen precursor;
  (d) purging excess ionized reducing agent to provide a film comprising SiN, wherein the substrate has a temperature of 23° C. to about 550° C.;
  (e) repeating (a)-(d);
  (f) exposing the film comprising SiN to a plasma treatment once about 10 to about 40 Angstroms of film have been deposited, wherein the film has a pattern loading effect of less than about 5.

11. A method of plasma enhanced atomic layer deposition of a film comprising SiN, the method comprising:
  loading a substrate into a processing chamber;
  exposing a substrate surface to a silicon precursor to provide a silicon precursor at the substrate surface, wherein the silicon precursor comprises a compound with a formula of $(X_yH_{3-y}Si)(CH_2)_n(SiX_yH_{3-y})$, wherein X is a halogen selected from Cl, Br or I, y is from 1 to 3 and n is 2 or 3, or a compound with a formula of $(X_yH_{3-y}Si)(CH_2)(SiX_pH_{2-p})(CH_2)(SiX_yH_{3-y})$, where X is a halogen selected from Cl, Br or I, y is from 1 to 3 and p is 0 to 2;
  purging excess silicon precursor;
  exposing the substrate surface to an ionized reducing agent comprising a nitrogen precursor, wherein the ionized reducing agent comprises a substituted hydrazine generated externally from the processing chamber; and purging excess ionized reducing agent to provide a film comprising SiN, wherein the substrate has a temperature of 23° C. to about 550° C.

* * * * *